United States Patent
Kim et al.

(10) Patent No.: US 11,189,674 B2
(45) Date of Patent: Nov. 30, 2021

(54) ANODE STRUCTURE, METHOD OF FORMING THE SAME AND ORGANIC LIGHT EMITTING DIODE DISPLAY DEVICE INCLUDING THE SAME

(71) Applicant: DB HITEK CO., LTD., Seoul (KR)

(72) Inventors: Young Jin Kim, Seoul (KR); Dae Il Kim, Cheongju-si (KR); Dong Hoon Park, Uiwang-si (KR)

(73) Assignee: DB HITEK CO., LTD., Seoul (KR)

( * ) Notice: Subject to any disclaimer, the term of this patent is extended or adjusted under 35 U.S.C. 154(b) by 0 days.

(21) Appl. No.: 16/818,155

(22) Filed: Mar. 13, 2020

(65) Prior Publication Data

US 2020/0295104 A1    Sep. 17, 2020

(30) Foreign Application Priority Data

Mar. 14, 2019    (KR) .................. 10-2019-0029095

(51) Int. Cl.
*H01L 27/32* (2006.01)
*H01L 51/52* (2006.01)

(52) U.S. Cl.
CPC ........ *H01L 27/3246* (2013.01); *H01L 27/322* (2013.01); *H01L 51/5209* (2013.01); *H01L 2227/323* (2013.01)

(58) Field of Classification Search
None
See application file for complete search history.

(56) References Cited

U.S. PATENT DOCUMENTS

| | | | |
|---|---|---|---|
| 2009/0001879 A1* | 1/2009 | Ikeda | H01L 27/3283 313/504 |
| 2016/0043334 A1* | 2/2016 | Sekine | C07D 498/14 257/40 |
| 2018/0151812 A1* | 5/2018 | Peng | H01L 51/0077 |
| 2019/0319081 A1* | 10/2019 | Kim | H01L 27/1248 |
| 2020/0176722 A1* | 6/2020 | Lu | H01L 51/56 |
| 2020/0212346 A1* | 7/2020 | Lee | H01L 51/5284 |
| 2020/0358019 A1* | 11/2020 | Tsai | H01L 51/56 |

* cited by examiner

*Primary Examiner* — Benjamin P Sandvik
(74) *Attorney, Agent, or Firm* — Patterson Thuente Pedersen, P.A.

(57) ABSTRACT

An anode structure includes an insulating interlayer pattern disposed on a substrate, the insulation interlayer pattern including a lower metal pattern for each of cell regions and via contacts extending in a vertical direction and being connected to the lower metal patterns therein, respectively, cell isolation pillars disposed on the insulation interlayer pattern, each of the cell isolation pillars extending in the vertical direction to electrically isolate the plurality of cells regions from one another, a reflective layer pattern disposed on the insulating interlayer pattern and between the cell isolation pillars, and an anode pattern disposed on the reflective layer pattern, the anode pattern being electrically connected to each of the via contacts through the reflective layer pattern.

19 Claims, 3 Drawing Sheets

ANODE STRUCTURE, METHOD OF FORMING THE SAME AND ORGANIC LIGHT EMITTING DIODE DISPLAY DEVICE INCLUDING THE SAME

CROSS-REFERENCE TO RELATED APPLICATION

This application claims priority to Korean Patent Application No. 10-2019-0029095, filed on Mar. 14, 2019 and all the benefits accruing therefrom under 35 U.S.C. § 119, the contents of which are incorporated by reference in their entirety.

TECHNICAL FIELD

The present disclosure relates to an anode structure, a method of forming the same, and a light emitting diode display device including the same. More particularly, the present disclosure relates to an anode structure defining a plurality of cell regions, a method of forming the anode structure and an organic light emitting diode display device including the anode structure.

BACKGROUND

Flat panel display devices such as a plasma display panel (PDP), a liquid crystal display device (LCD), and an organic light emitting diode (OLED) display device have been widely studied and utilized.

The OLED display device is classified as one of a spontaneous light emitting device, which may make it possible to be downsized and lightened because the OLED display device may omit a backlight unit which has been normally implemented into conventional LCD devices.

Further, the OLED display device has a viewing angle and contrast ratio higher than those of the LCD devices using conventional liquid crystals. Furthermore, the OLED display device may have advantages in terms of reduced power consumption, and the OLED display device can be driven by a relatively low DC voltage and has a quick response speed. The OLED display device may be resistant to external impact and has a wide driving temperature range. Since the manufacturing process for OLED devices is simple, there is an advantage that the production cost may be saved compared to the conventional LCD device.

The OLED display device includes a signal control unit for controlling a signal for each pixel, a light emitting unit for generating light for each pixel using an organic material in response to the signal, and an anode structure and a cathode structure which the light emitting unit is interposed between. The OLED display device may emit light generated in the light emitting unit upwardly through the cathode unit to illuminate the display.

However, light generated in the light emitting unit may be directed downwardly to the signal control unit. In particular, light may affect active elements provided in the signal control unit. For example, when an electrically erasable programmable read-only memory (EEPROM) or an erasable programmable read-only memory (EPROM) is provided as an example of the active elements, charges may be activated, thereby causing the charges to be abnormally emitted from the floating gate when light irradiates to the charges present in the floating gate. As a result, light incident on the signal control unit may cause a malfunction of the active elements.

The anode unit may include an anode electrode capable of applying a voltage to each cell, and a reflector being configured to upwardly reflect light generated by the light emitting unit. It may be necessary for the reflector to have a relatively good light reflectance. In addition, the anode electrode may be required to have a relatively high work function (for example, 5 eV or more), thereby effectively injecting holes into the hole injection layer of the light emitting unit. On the other hand, when the anode unit has a stack structure including an aluminum thin film and a titanium nitride thin film, it is possible to secure a light reflectance of about 80%. However, in this case, as the anode unit has a work function of 4.5 eV or less, there may cause a hole injection efficiency to deteriorate.

SUMMARY

The example embodiments of the present invention provide an anode structure having a high reflective efficiency and improved work function.

The example embodiments of the present invention provide a method of forming an anode structure having a high reflective efficiency and improved work function.

The example embodiments of the present invention provide an organic light emitting diode display (OLED) device including an anode structure having a high reflective efficiency and improved work function.

According to an example embodiment of an anode structure of an OLED device, the anode structure includes a substrate defining a plurality of cell regions, an insulating interlayer pattern disposed on the substrate, the insulation interlayer pattern including a lower metal pattern for each of the cell regions and via contacts extending in a vertical direction and being connected to the lower metal patterns therein, respectively, cell isolation pillars disposed on the insulation interlayer pattern, each of the cell isolation pillars extending in the vertical direction to electrically isolate the plurality of cells regions from one another, a reflective layer pattern disposed on the insulating interlayer pattern and between the cell isolation pillars, and an anode pattern disposed on the reflective layer pattern, the anode pattern being electrically connected to each of the via contacts through the reflective layer pattern.

In an example embodiment, the reflective layer pattern includes silver or aluminum, and the anode pattern includes indium-tin-oxide (ITO).

In an example embodiment, each of the cell isolation pillars has an upper surface co-planar with that of the anode pattern.

In an example embodiment, a buffer layer pattern is additionally provided to be interposed between the insulating interlayer pattern and the reflective layer pattern.

In an example embodiment, the reflective layer pattern includes silver or aluminum, the anode pattern includes ITO, and the buffer layer pattern includes tin nitride.

In an example embodiment, the reflective layer pattern, the anode pattern and the buffer layer pattern are positioned between the cell isolation pillars and adjacent to each other.

According to an example embodiment, a method of forming an anode structure is provided. The method includes preparing a substrate defining a plurality of cell regions, forming an insulating interlayer pattern on the substrate, the insulation interlayer including a lower metal pattern for the cell regions and via contacts extending in a vertical direction to be connected to the lower metal patterns therein, respectively, forming cell isolation pillars on the insulation interlayer pattern, each of the cell isolation pillars extending in the vertical direction to electrically isolate the plurality of cells regions from one another, forming a reflective layer pattern disposed on the insulating interlayer pattern and between the cell isolation pillars, and forming an anode pattern on the reflective layer pattern, the anode pattern being electrically connected to each of the via contacts through the reflective layer pattern.

In an example embodiment, forming the reflective layer pattern and the anode pattern may includes forming a reflective layer on the insulating interlayer pattern conformally to cover the cell isolation pillars, forming an anode layer on the reflective layer, and planarizing the reflective layer and the anode layer to expose upper surfaces of the cell isolation pillars.

Here, planarizing the reflective layer and the anode layer may include performing a chemical and mechanical polishing process.

In an example embodiment, the reflective layer pattern includes silver or aluminum, and the anode pattern includes ITO.

In an example embodiment, each of the cell isolation pillars has an upper surface co-planar with that of the anode pattern.

In an example embodiment, a buffer layer pattern is further formed to be interposed between the insulating interlayer pattern and the reflective layer pattern.

Here, the reflective layer pattern includes silver or aluminum, the anode pattern includes ITO, and the buffer layer pattern includes tin nitride.

According to an example embodiment, an organic light emitting diode display device includes a signal control unit including a driving circuit for each cells, an anode structure of an organic light emitting diode display device, the anode structure including a substrate defining a plurality of cell regions, an insulating interlayer pattern disposed on the substrate, the insulation interlayer pattern including a lower metal pattern for the cell regions and via contacts extending in a vertical direction and being connected to the lower metal patterns therein, respectively, cell isolation pillars disposed on the insulation interlayer pattern, each of the cell isolation pillars extending in the vertical direction to electrically isolate the plurality of cells regions from one another, a reflective layer pattern disposed on the insulating interlayer pattern and between the cell isolation pillars, and an anode pattern disposed on the reflective layer pattern, the anode pattern being electrically connected to each of the via contacts through the reflective layer pattern, a light emitting unit disposed on the anode structure, the light emitting unit emitting light in accordance with a driving signal transmitted from the driving circuit, a cathode unit disposed on the light emitting unit, the cathode unit being configured to drive the light emitting unit with cooperation with the anode structure, and a color filter unit disposed on the cathode unit, the color filter unit being configured to control a color index of light emitted from the light emitting unit.

In an example embodiment, the reflective layer pattern includes silver or aluminum, and the anode pattern includes ITO.

In an example embodiment, each of the cell isolation pillars has an upper surface co-planar with that of the anode pattern.

In an example embodiment, a buffer layer pattern is further formed to be interposed between the insulating interlayer pattern and the reflective layer pattern.

Here, the reflective layer pattern includes silver or aluminum, the anode pattern includes ITO, and the buffer layer pattern includes tin nitride.

In an example embodiment, the color filter unit includes a red filter, a green filter and a blue filter.

According to some embodiments of the present invention, the anode structure includes the cell isolation pillars and the anode pattern having upper surfaces coplanar with one another. As a result, other elements may be easily formed on the anode structure. In addition, a distortion phenomenon of light reflected from the anode structure, such as refraction or diffraction, may be suppressed from occurring.

On the other hand, the anode pattern may be made of a light transmitting material such as indium-tin oxide. That is, the anode pattern may effectively transmit light upwardly reflected from the reflective layer pattern. In addition, when the anode pattern is formed of indium-tin oxide, the anode pattern may have a work function similar to that of an organic material of the light emitting unit included in the organic light emitting diode display device. Accordingly, the anode structure including the anode pattern may effectively inject holes into a hole injection layer included in the light emitting unit.

Furthermore, the anode pattern and the reflective layer pattern having the upper surfaces co-planar together with the cell isolation pillars may be easily formed through the planarization process.

BRIEF DESCRIPTION OF THE DRAWINGS

Example embodiments can be understood in more detail from the following description taken in conjunction with the accompanying drawings, in which.

DETAILED DESCRIPTION OF EMBODIMENTS

Hereinafter, specific embodiments will be described in more detail with reference to the accompanying drawings. The present invention may, however, be embodied in different forms and should not be construed as limited to the embodiments set forth herein.

As an explicit definition used in this application, when a layer, a film, a region or a plate is referred to as being 'on' another one, it can be directly on the other one, or one or more intervening layers, films, regions or plates may also be present. Unlike this, it will also be understood that when a layer, a film, a region or a plate is referred to as being 'directly on' another one, it is directly on the other one, and one or more intervening layers, films, regions or plates do not exist. Also, though terms like a first, a second, and a third are used to describe various components, compositions, regions and layers in various embodiments of the present invention are not limited to these terms.

Furthermore, and solely for convenience of description, elements may be referred to as "above" or "below" one another. It will be understood that such description refers to the orientation shown in the Figure being described, and that in various uses and alternative embodiments these elements could be rotated or transposed in alternative arrangements and configurations. Similarly, "vertical" and "horizontal" are used throughout this application to refer to the orientation depicted in the accompanying figures, and it should be understood that these terms do not necessarily refer to a gravitational or other frame of reference, since the devices and methods described herein need not be arranged in any particular orientation.

In the following description, the technical terms are used only for explaining specific embodiments while not limiting the scope of the present invention. Unless otherwise defined herein, all the terms used herein, which include technical or scientific terms, may have the same meaning that is generally understood by those skilled in the art.

The depicted embodiments are described with reference to schematic diagrams of some embodiments of the present invention. Accordingly, changes in the shapes of the diagrams, for example, changes in manufacturing techniques and/or allowable errors, are sufficiently expected. Accordingly, embodiments of the present invention are not described as being limited to specific shapes of areas described with diagrams and include deviations in the shapes and also the areas described with drawings are entirely schematic and their shapes do not represent accurate shapes and also do not limit the scope of the present invention.

Figure 1:
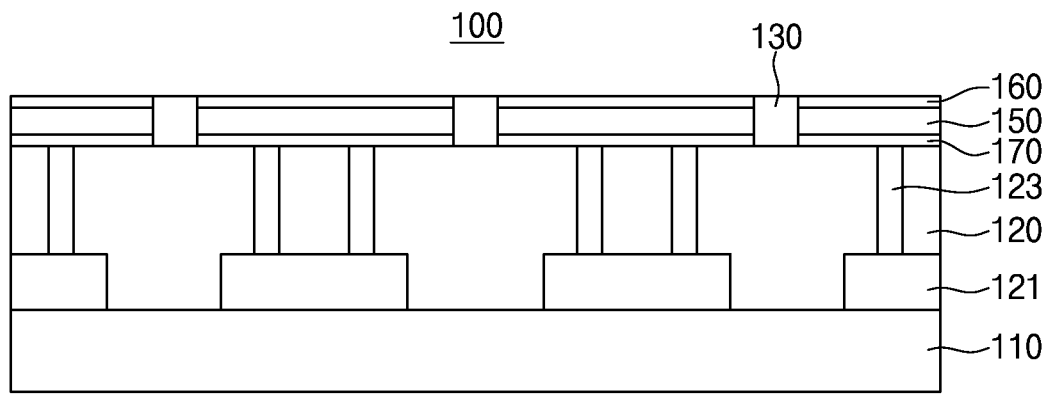
FIG. 1 is a cross sectional view illustrating an anode structure for an organic light emitting diode (OLED) display device in accordance with an example embodiment of the present invention.

FIG. 1 is a cross sectional view illustrating an anode structure 100 for an organic light emitting diode (OLED) display device in accordance with an example embodiment of the present invention.

Referring to FIG. 1, an anode structure 100 according to an example embodiment of the present invention includes a substrate 110, an insulating interlayer 120, cell isolation pillars 130, a reflective layer pattern 150 and an anode pattern 160. The anode structure 100 may be positioned on a light emitting unit (not shown) which is interposed between the anode structure 100 and the cathode structure (not shown) such that the anode structure 100 faces the cathode structure. Both the anode structure 100 and the cathode structure control an operation of the light emitting unit.

The substrate 110 defines a plurality of cell regions. The substrate 110 includes a driving circuit (not shown) for independently driving each cell formed in the cell regions. For example, the driving circuit includes an active element. The cell regions may correspond to a pixel of the display device.

The insulating interlayer pattern 120 is disposed on the substrate 110. The insulating interlayer pattern 120 may electrically isolate the driving circuit included in the substrate 110 from the light emitting unit which is positioned on the insulating interlayer pattern 120.

The insulating interlayer pattern 120 may include a lower metal pattern 121 and via contacts 123 therein.

The lower metal pattern 121 is provided on an upper surface of the substrate 110. In other words, the lower metal pattern 121 is disposed at a lower portion of the insulating interlayer pattern 120. The lower metal pattern 121 is provided for each cell regions. The lower metal pattern 121 may electrically connect the driving circuit formed in the substrate 110 and the light emitting unit to each other.

The via contacts 123 may penetrate the insulating interlayer pattern 120 in a vertical direction. The via contacts 123 may be provided for each cell regions. Each of the via contacts 123 contacts an upper surface of the lower metal pattern 121. As a result, the via contacts 123 are electrically connected to the lower metal pattern 121.

The cell isolation pillars 130 are positioned on the insulating interlayer pattern 120. The cell isolation pillars 130 extend from an upper surface of the insulating interlayer pattern 120 in the vertical direction. The cell isolation pillars 130 may electrically isolate the cell regions from one another. The cell isolation pillars 130 may include oxide. Therefore, the cell isolation pillars 130 may suppress a lateral leakage current from occurring between the anode patterns 160.

The reflective layer pattern 150 is positioned on the insulating interlayer pattern 120. In addition, the reflective layer pattern 150 is positioned between the cell isolation pillars 130. The reflective layer pattern 150 is provided to reflect light downwardly incident from the light emitting unit. The reflective layer pattern 150 includes, for example, silver or aluminum. Accordingly, the reflective layer pattern 150 may have a relatively excellent light reflectance.

The anode pattern 160 is positioned on the reflective layer pattern 150. The anode pattern 160 may be electrically connected to the via contacts 123 through the reflective layer pattern 165. The anode pattern 160 is positioned between the cell isolation pillars 130. Therefore, the anode pattern 160 and the reflective layer pattern 150 are positioned between the cell isolation pillars 130.

When the anode structure 100 is adapted to the organic light emitting diode display, the anode pattern 160 may function as an anode electrode.

The anode pattern 160 may be made of a light transmitting material such as indium tin oxide (ITO). That is, the anode pattern 160 may effectively transmit light reflected from the reflective layer pattern 150 upwardly. In addition, when the anode pattern 160 is formed of ITO, the anode pattern 160 may have a work function similar to that of an organic material forming the light emitting unit included in the organic light emitting diode display device. For example, the anode pattern 160 may have a work function of 5 eV similar to the organic material. Therefore, the anode structure 100 including the anode pattern 160 may effectively inject holes into a hole injection layer included in the light emitting unit.

Each of the cell isolation pillars 130 and the anode pattern 160 may have an upper surface at the same height, respective to one another. That is, the cell isolation pillars 130 may have the upper surface co-planar with that of and the anode pattern 160. Therefore, another element such as the light emitting unit may be easily positioned on the anode structure 100. In addition, a distortion phenomenon such as refraction or diffraction, of reflected light reflected from the anode structure 100 may be suppressed.

In an example embodiment of the present invention, a buffer layer pattern 170 is additionally provided. The buffer layer pattern 170 may be interposed between the insulating interlayer pattern 120 and the reflective layer pattern 150. The buffer layer pattern 170 may serve for buffering a difference between the insulating interlayer pattern 120 and the reflective layer pattern 150. As a result, the anode structure 100 may secure the structural and electrical stability owing to the buffer layer pattern 170.

The reflective layer pattern 150 may be made of silver (Ag) or aluminum (Al), the anode pattern 160 may be made of indium-tin-oxide (ITO), and the buffer layer pattern 170 may be made of tin nitride. In addition, all of the reflective layer pattern 150, the anode pattern 160, and the buffer layer pattern 170 are positioned between adjacent cell isolation pillars, in the embodiment shown in FIG. 1.

According to an example embodiment of the present invention, each of the cell isolation pillars 130 and the anode pattern 160 may have an upper surface coplanar with one another. As a result, other elements may be easily formed on the anode structure 100. Further, a distortion phenomenon such as refraction or diffraction, of reflected light reflected from the anode structure 100 may be suppressed.

Further, since the anode pattern 160 may be made of a light transmitting material such as indium tin oxide (ITO), the anode pattern 160 may effectively transmit light upwardly reflected from the reflective layer pattern 150. In addition, the anode pattern 160 may have a work function of 5 eV similar to that of the organic material included in the light emitting unit. Therefore, the anode structure 100 including the anode pattern 160 may effectively inject holes into the hole injection layer included in the light emitting unit FIGS. 2 to 7 are cross sectional views illustrating a method of forming an anode structure in accordance with an example embodiment of the present invention.

Figure 2:
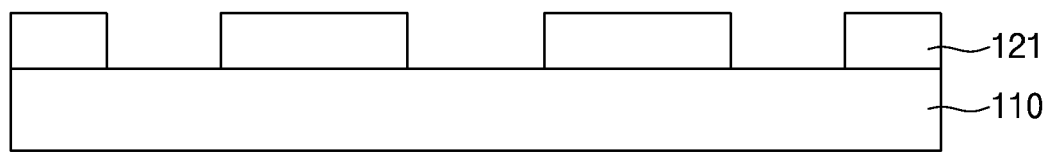
FIGS. 2 to 7 are cross sectional views illustrating a method of forming an anode structure in accordance with an example embodiment of the present invention.

Referring to FIG. 2, a substrate 110 defining a plurality of cell regions is prepared. The substrate 110 is divided into a plurality of cells. The substrate 110 may include a driving circuit capable of independently driving a plurality of cells. For example, the driving circuit may include an active element. The cells may correspond to pixels of a display device. A lower metal pattern 121 is formed on the substrate 110 to be positioned in each of the cell regions.

Subsequently, an insulating interlayer pattern 120 is formed on the substrate 110 including the lower metal pattern 121 and via contacts 123 being electrically connected to the lower metal pattern 121 and extending in a vertical direction (see FIG. 4).

Figure 3:
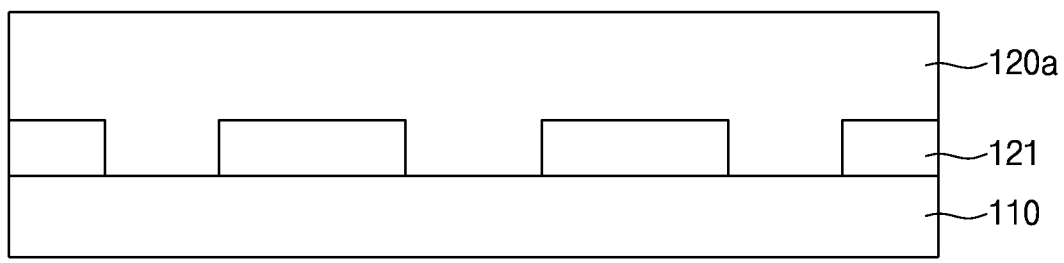

Referring to FIG. 3, an insulating interlayer 120a is formed on the substrate 110 to cover the lower metal pattern 121. The insulating interlayer 120a may be formed using oxide. The insulating interlayer 120a may be formed through a chemical vapor deposition (CVD) process. Subsequently, a planarization process for planarizing an upper surface of the insulating interlayer 120a may be performed.

Figure 4:
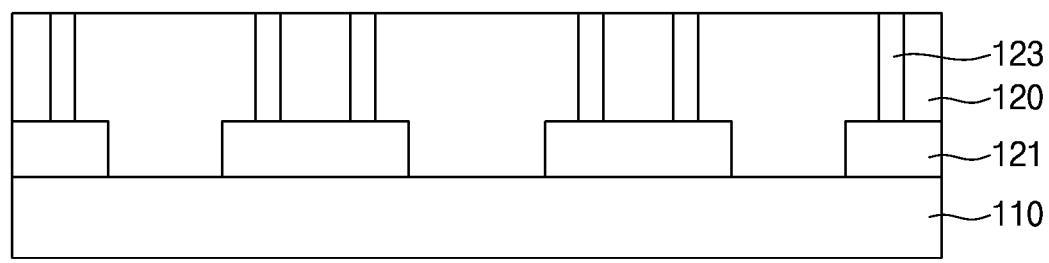

Referring to FIG. 4, via holes (not shown) are formed in the insulating interlayer 120a. The via holes expose an upper surface of the lower metal pattern 121. An etching process may be performed to form the via holes. In this case, the insulating interlayer pattern 120 is transformed from the insulating interlayer 120a.

The via holes are filled with a conductive material to form via contacts 123. The via contact 123 may be formed using a polysilicon material or a metal material. A plasma enhanced chemical vapor deposition (PE-CVD) process may be performed to form the via contacts 123. Thus, the via holes may be effectively filled without voids.

Figure 5:
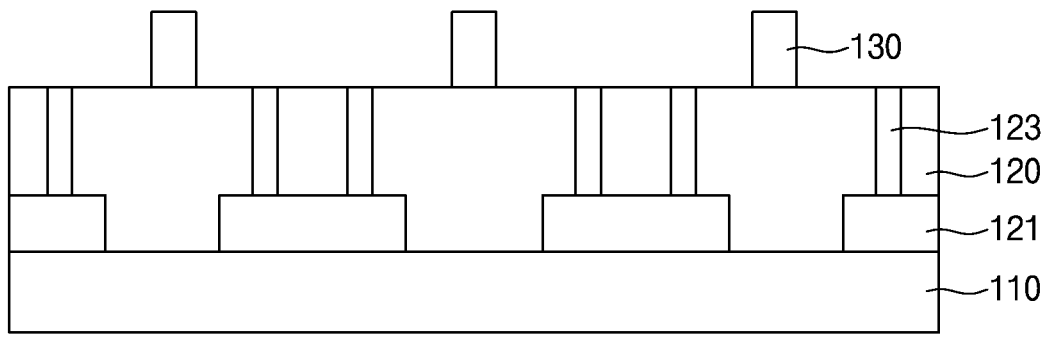

Referring to FIG. 5, cell isolation pillars 130 are formed on the insulating interlayer pattern 120 to extend in a vertical direction. The cell isolation pillars electrically isolate the cells regions from one another. The cell isolation pillars 130 may be formed of an insulating material such as oxide. In order to form the cell isolation pillars 130, an insulating layer (not shown) is formed on the insulating interlayer pattern 120. Subsequently, an etching process for patterning the insulating layer is performed to form the cell isolation pillars 130 that isolate the cell regions from each other.

Figure 6:
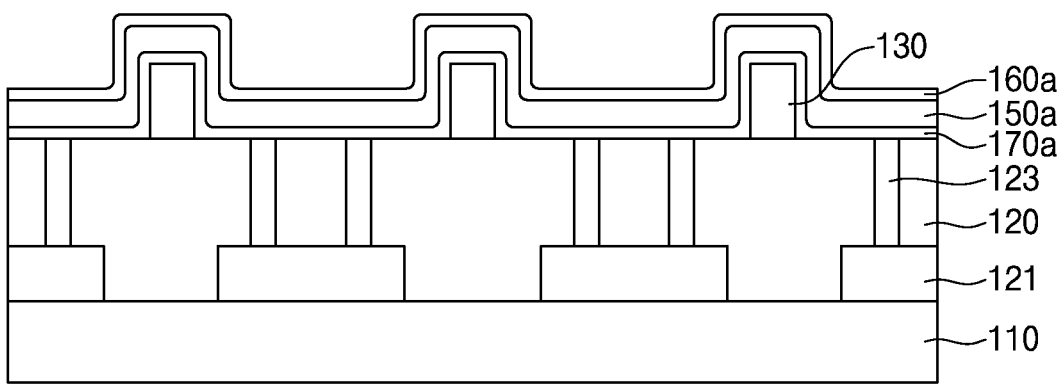

Referring to FIG. 6, the reflective layer 150a and the anode layer 160a are sequentially formed on the insulating interlayer pattern 120 to cover the cell isolation pillars 130. Before forming the reflective layer 150a, a buffer layer 170a may be additionally formed on the insulating interlayer 120a.

The reflective layer 150a may be made of silver or aluminum, and the anode layer 160a may be formed using indium-tin-oxide. The buffer layer 170a may be formed of tin nitride.

Figure 7:
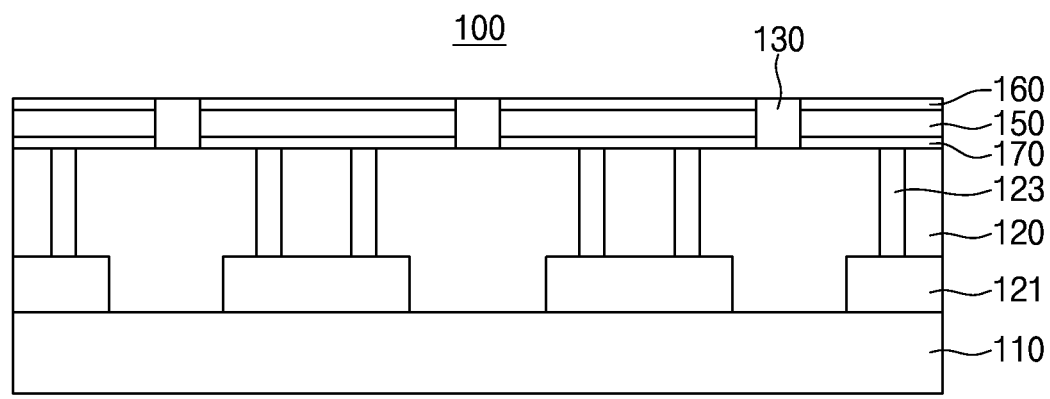

Referring to FIG. 7, the planarization process is performed on the reflective layer 150a and the anode layer 160a to expose upper surfaces of the cell isolation pillars 130. Thus, the reflective layer pattern 150 and the anode pattern 160 are formed between the cell isolation pillars 130 adjacent to each other. The planarization process may include, for example, a chemical mechanical polishing process. Accordingly, the anode structure 100 including the reflective layer pattern 150, the anode pattern 160 and the cell isolation pillars.

Figure 8:
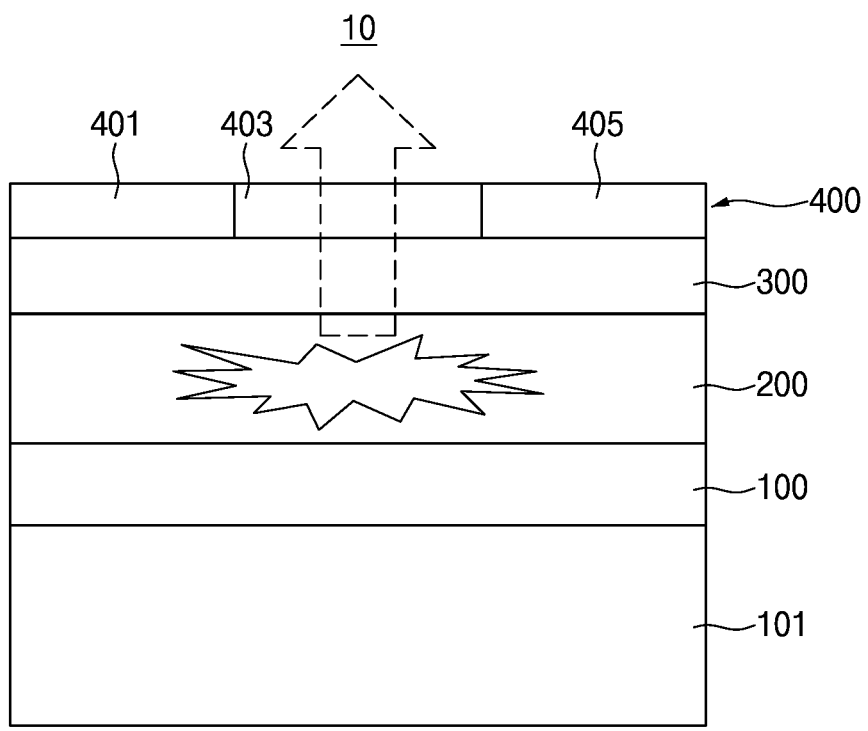
FIG. 8 is a cross sectional view illustrating an organic light emitting display device.

FIG. 8 is a cross sectional view illustrating an organic light emitting display device.

In FIG. 8, an organic light emitting diode display device 10 according to an example embodiment of the present invention includes a signal control unit 101, an anode structure 100, a light emitting unit 200, a cathode unit 300 and a color filter unit 400.

The signal control unit 101 includes a substrate (not shown) and an active element (not shown) formed for each pixel on the substrate.

The substrate includes, for example, a glass substrate or a polyimide substrate having flexible properties.

The active element includes, for example, a diode or a transistor. Furthermore, the active element may include an erasable programmable read only memory (EPROM) capable of erasing data by irradiating ultraviolet rays, and an electrically erasable programmable read only memory (EEPROM) capable of erasing data using electricity instead of ultraviolet rays. In this case, the active element may control a signal using a floating gate. The floating gate may be filled with charges or may remove the charges to store or erase data therein.

The anode structure 100 has been described in detail with reference to FIG. 1, a detailed description about the anode structure 100 will be omitted.

The light emitting unit 200 is provided over the signal control unit 101, that is, on the anode structure 100. The light emitting unit 200 is driven by a signal generated from the signal control unit 101.

The cathode unit 300 is provided on the light emitting unit 200. The cathode unit 300 drives the light emitting unit 200 together with the anode structure 100. The cathode unit 300 defines a P-N junction with the anode structure 100 including the anode pattern 160 (see FIG. 1) serving as an anode electrode.

The color filter unit 300 is provided on the cathode unit 300. The color filter unit 300 displays an image o the outside. The color filter unit 300 includes a plurality of filters 401, 403, and 405 that can realize red, green, and blue colors. Each of the filters may be provided for each cell.

Although the anode structure and the organic light emitting diode display have been described with reference to the specific embodiments, they are not limited thereto. Therefore, it will be readily understood by those skilled in the art that various modifications and changes can be made thereto without departing from the spirit and scope of the appended claims.

What is claimed is:

1. An anode structure of an organic light emitting diode display device, the anode structure comprising:
 a substrate defining a plurality of cell regions;
 an insulating interlayer pattern disposed on the substrate, the insulation interlayer pattern including a lower metal pattern for each of the plurality of cell regions and via contacts extending in a vertical direction and each being connected to the lower metal pattern of a corresponding one of the plurality of cell regions;
 a plurality of cell isolation pillars disposed on the insulation interlayer pattern, each cell isolation pillar of the plurality of cell isolation pillars extending in the vertical direction such that the plurality of cell isolation pillars combine to electrically isolate the plurality of cells regions from one another;
a reflective layer pattern disposed on the insulating interlayer pattern and between the cell isolation pillars; and
an anode pattern disposed on the reflective layer pattern, the anode pattern being electrically connected to each of the via contacts through the reflective layer pattern.

2. The anode structure of claim 1, wherein the reflective layer pattern includes silver or aluminum, and the anode pattern includes indium-tin-oxide ITO.

3. The anode structure of claim 1, wherein each of the cell isolation pillars has an upper surface that is co-planar with an upper surface of the anode pattern.

4. The anode structure of claim 1, further comprising a buffer layer pattern interposed between the insulating interlayer pattern and the reflective layer pattern.

5. The anode structure of claim 1, wherein the reflective layer pattern includes silver or aluminum, the anode pattern includes indium-tin-oxide ITO, and the buffer layer pattern includes tin nitride.

6. The anode structure of claim 1, wherein the reflective layer pattern, the anode pattern and the buffer layer pattern are positioned between the cell isolation pillars adjacent to each other.

7. A method of forming an anode structure, the method comprising:
preparing a substrate defining a plurality of cell regions;
forming an insulating interlayer pattern on the substrate, the insulation interlayer including a lower metal pattern for each region of the plurality of cell regions and a plurality of via contacts extending in a vertical direction to be connected to the lower metal pattern of a corresponding one of the plurality of cell regions;
forming a plurality of cell isolation pillars on the insulation interlayer pattern, each cell isolation pillar of the plurality of cell isolation pillars extending in the vertical direction such that the plurality of cell isolation pillars combine to electrically isolate the plurality of cells regions from one another;
forming a reflective layer pattern disposed on the insulating interlayer pattern and between the cell isolation pillars; and
forming an anode pattern on the reflective layer pattern, the anode pattern being electrically connected to each of the via contacts through the reflective layer pattern.

8. The method of claim 7, wherein forming the reflective layer pattern and the anode pattern comprises:
forming a reflective layer on the insulating interlayer pattern conformally to cover the cell isolation pillars;
forming an anode layer on the reflective layer; and
planarizing the reflective layer and the anode layer to expose upper surfaces of the cell isolation pillars.

9. The method of claim 7, wherein planarizing the reflective layer and the anode layer includes performing a chemical and mechanical polishing process.

10. The method of claim 7, wherein the reflective layer pattern includes silver or aluminum, and the anode pattern includes indium-tin-oxide ITO.

11. The method of claim 7, wherein each of the cell isolation pillars has an upper surface co-planar with an upper surface of the anode pattern.

12. The method of claim 7, further comprising forming a buffer layer pattern interposed between the insulating interlayer pattern and the reflective layer pattern.

13. The method of claim 12, wherein the reflective layer pattern includes silver or aluminum, the anode pattern includes indium-tin-oxide ITO, and the buffer layer pattern includes tin nitride.

14. An organic light emitting diode display device comprising:
a signal control unit including a plurality of driving circuits;
an anode structure of an organic light emitting diode display device, the anode structure including a substrate defining a plurality of cell regions, an insulating interlayer pattern disposed on the substrate, the insulation interlayer pattern including a lower metal pattern for the plurality of cell regions and via contacts extending in a vertical direction to be connected to the lower metal pattern of a corresponding one of the plurality of cell regions, a plurality of cell isolation pillars disposed on the insulation interlayer pattern, each cell isolation pillar of the plurality of cell isolation pillars extending in the vertical direction such that the plurality of cell isolation pillars combine to electrically isolate the plurality of cells regions from one another, a reflective layer pattern disposed on the insulating interlayer pattern and between the cell isolation pillars, and an anode pattern disposed on the reflective layer pattern, the anode pattern being electrically connected to each of the via contacts through the reflective layer pattern;
a light emitting unit disposed on the anode structure, the light emitting unit emitting light in accordance with a driving signal transmitted from each of the driving circuits corresponding to each of the cell regions;
a cathode unit disposed on the light emitting unit, the cathode unit being configured to drive the light emitting unit with cooperation with the anode structure; and
a color filter unit disposed on the cathode unit, the color filter unit being configured to control color index of light emitted from the light emitting unit.

15. The organic light emitting diode display device of claim 14, wherein the reflective layer pattern includes silver or aluminum, and the anode pattern includes indium-tin-oxide ITO.

16. The organic light emitting diode display device of claim 14, wherein each of the cell isolation pillars has an upper surface co-planar with an upper surface of the anode pattern.

17. The organic light emitting diode display device of claim 14, further comprising a buffer layer pattern interposed between the insulating interlayer pattern and the reflective layer pattern.

18. The organic light emitting diode display device of claim 17, wherein the reflective layer pattern includes silver or aluminum, the anode pattern includes indium-tin-oxide ITO, and the buffer layer pattern includes tin nitride.

19. The organic light emitting diode display device of claim 14, wherein the color filter unit includes a red filter, a green filter and a blue filter.

* * * * *